United States Patent [19]

Kwong et al.

[11] Patent Number: 5,397,720
[45] Date of Patent: Mar. 14, 1995

[54] METHOD OF MAKING MOS TRANSISTOR HAVING IMPROVED OXYNITRIDE DIELECTRIC

[75] Inventors: Dim-Lee Kwong; Giwan Yoon; Jonghan Kim, all of Austin, Tex.

[73] Assignee: The Regents of the University of Texas System, Austin, Tex.

[21] Appl. No.: 179,016

[22] Filed: Jan. 7, 1994

[51] Int. Cl.$^6$ ......................................... H01L 21/265
[52] U.S. Cl. ..................................... 437/40; 437/242; 437/244; 437/239; 437/41; 437/235; 148/DIG. 112
[58] Field of Search ................ 437/40, 242, 244, 239, 437/41, 235; 148/DIG. 112

[56] References Cited

U.S. PATENT DOCUMENTS

| | | | |
|---|---|---|---|
| 3,422,321 | 1/1969 | Tombs | 317/235 |
| 3,629,088 | 12/1971 | Frank et al. | 204/192 |
| 4,188,565 | 2/1980 | Mizukami et al. | 313/509 |
| 4,438,157 | 3/1984 | Romano-Moran | 427/93 |
| 4,581,622 | 4/1986 | Takasaki et al. | 357/23.5 |
| 4,620,986 | 11/1986 | Yau et al. | 427/93 |
| 4,702,936 | 10/1987 | Maeda et al. | 427/54.1 |
| 4,721,631 | 1/1988 | Endo et al. | 427/66 |
| 4,901,133 | 2/1990 | Curran et al. | 357/54 |
| 4,980,307 | 12/1990 | Ito et al. | 437/40 |
| 5,254,489 | 10/1993 | Nakata | 437/40 |
| 5,254,506 | 10/1993 | Hori | 437/242 |
| 5,258,333 | 11/1993 | Shappir et al. | 437/242 |

FOREIGN PATENT DOCUMENTS

| | | |
|---|---|---|
| 0259826 | 3/1988 | European Pat. Off. . |
| 0289246 | 11/1988 | European Pat. Off. . |
| 0305741 | 3/1989 | European Pat. Off. . |
| 0113335 | 9/1980 | Japan .......... 437/242 |
| 0172339 | 8/1986 | Japan .......... 437/242 |
| 0169932 | 7/1989 | Japan .......... 437/242 |
| 0018934 | 1/1990 | Japan .......... 437/242 |
| 0257828 | 11/1991 | Japan .......... 437/239 |
| 0283679 | 10/1993 | Japan . |
| 8302199 | 6/1983 | WIPO . |
| 8400852 | 3/1984 | WIPO . |
| 8605323 | 9/1986 | WIPO . |
| 8705439 | 9/1987 | WIPO . |
| 9003560 | 4/1990 | WIPO . |

OTHER PUBLICATIONS

Hwang, et al., "Electrical Characteristics of Ultrathin Oxynitride Gate Dielectric Prepared by Rapid Thermal Oxidation . . . " Appl. Phys. Lett. 57 (10), 3 Sep. 1990, pp. 1010–1011.

Hwang, et al., "Electrical and Reliability Characteristics of Ultrathin Oxynitride Gate Dielectric Prepared by Rapid Ther . . . " I.E.D.M. 90-421, 1990, pp. 16.5.1–16.5.4.

Ting, et al., "Composition and Growth Kinetics of Ultrathin SiO2 Films Formed by Oxidizing Si Substrates in N2O," Appl. Phys. Lett. 57 (26), 24 Dec. 1990, pp. 2808–2810.

Hwang, et al., "Improved Reliability Characteristics of Submicron NMOSFETS with Oxynitride Gate Dielectric Prepared By . . . " Elec. Dev. Lett., Mar. 25, 1991, pp. 1–14.

Joshi et al.; "Oxynitride Gate Dielectrics for P+-Polysilicon Gate MOS Devices"; IEEE Electron Devices Lett., vol. 14, No. 12, Dec. 1993; pp. 560–562.

Primary Examiner—Brian E. Hearn
Assistant Examiner—Trung Dang
Attorney, Agent, or Firm—Townsend and Townsend Khourie and Crew

[57] ABSTRACT

High quality ultrathin gate oxides having nitrogen atoms therein with a profile having a peak at the silicon oxide-silicon interface are formed by oxidizing a surface of a monocrystalline silicon body in an atmosphere of nitrous oxide (N$_2$O) at a temperature above 900° C. preferably in the range of 900°–1100° C., and then heating the silicon body and oxidized surface in an atmosphere of anhydrous ammonia to introduce additional nitrogen atoms into the oxide and increase resistance to boron penetration without degrading the oxide by charge trapping. The resulting oxynitride has less degradation under channel hot electron stress and approximately one order of magnitude longer lifetime than that of conventional silicon oxide in MIS applications.

18 Claims, 5 Drawing Sheets

METHOD OF MAKING MOS TRANSISTOR HAVING IMPROVED OXYNITRIDE DIELECTRIC

BACKGROUND OF THE INVENTION

This invention relates generally to semiconductor processing technology and more particularly the invention relates to dielectrics used in submicron devices as used in ULSI microelectronic circuits.

The metal-insulator-silicon (MIS) transistor including the metal-oxide-silicon (MOS) transistor is used in large scale integrated (LSI), very large scale integrated (VLSI), and ultra large scale integrated (ULSI) microelectronic circuits. The transistor has a current carrier source region formed in a surface of a semiconductor (e.g., silicon) body, a carrier drain region formed in the surface and spaced from the source, and between the source and drain is a channel region through which the current carriers flow. Overlying the channel region and aligned with edges of the source and drain is a gate electrode which is physically and electrically separated from the channel by a dielectric layer. Typically the dielectric comprises a silicon oxide ($SiO_2$).

To provide stress relief and to enhance the electrical qualities of the dielectric, a silicon nitride ($Si_3N_N$) layer has been placed over the silicon oxide layer between the gate electrode and the channel region. Additionally, nitride ions have been placed in the silicon oxide layer by ion implantation and by $NH_3$ (anhydrous ammonia) nitridation.

However, $NH_3$ nitridation incorporates hydrogen in the oxides, which increases electron trapping significantly. Reoxidation of nitrided oxides (ROXNOX) is unable to eliminate the nitridation induced electron traps, leading to worse hot carrier reliability of p-MOSFETs. Even in n-MOSFETs with ROXNOX $SiO_2$, the hot carrier reliability is degraded under peak $I_g$ stress due to the presence of electron traps. Although the electron trapping problem can be reduced by using a very light nitridation, the resulting oxides do not show sufficient resistance to boron penetration. Consequently, (reoxidized) $NH_3$-nitrided gate oxides may not be adequate for $p^+$-polysilicon gated p-MOSFETs. On the other hand, alternatives to (reoxidized) $NH_3$-nitrided oxides, namely $N_2O$-nitrided and $N_2O$-grown oxides may not contain sufficient nitrogen atoms to prevent boron penetration.

The present invention is directed to an improved dielectric for use in deep submicron MOS devices and the fabrication thereof.

SUMMARY OF THE INVENTION

In accordance with the invention, a silicon oxide dielectric is grown in a nitrous oxide ($N_2O$) environment and then nitrided in an anhydrous ammonia ($NH_3$) atmosphere to introduce a sufficient amount of nitrogen at the silicon/silicon oxide interface to provide resistance to boron penetration but with reduced electron traps induced from the nitridation as compared to pure silicon oxide which has been nitrided.

In fabricating the dielectric, a silicon surface is oxidized in an atmosphere consisting essentially of nitrous oxide ($N_2O$). In preferred embodiments, a pure (e.g., 99.998%) nitrous oxide gas is employed at a temperature of approximately 900°–1100° C. Ultrathin (approximately 60–65 Å) gate dielectrics can be grown having a nitrogen rich layer at the silicon/silicon oxide interface. Thereafter, the structure is placed in an atmosphere of $NH_3$ at a temperature in the range of 800° C.–950° C. for a period of time between 30 seconds and 30 minutes; to introduce additional nitrogen atoms. The structure is then annealed in a nitrogen gas ($N_2$) atmosphere.

Results show that $NH_3$-nitrided $N_2O$-oxides have excellent electrical (low $N_f$) and reliability properties (smaller charge trapping and suppressed interface state generation) comparable to $N_2O$ oxides, with an additional advantage of significantly improved resistance to boron penetration.

The invention and objects and features thereof will be more readily apparent from the following description and appended claims when taken with the drawing.

DETAILED DESCRIPTION OF ILLUSTRATIVE EMBODIMENTS

Figure 1:
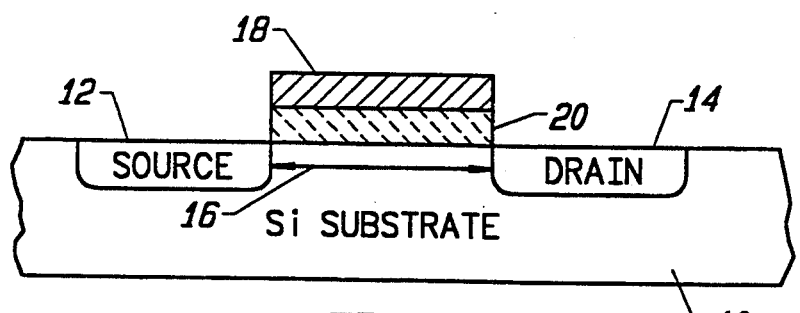
FIG. 1 is a section view of an MIS transistor including a dielectric in accordance with the invention.

Referring now to the drawing, FIG. 1 is a section view of a MISFET transistor including a dielectric in accordance with the invention. The transistor is formed in a silicon substrate 10 with a carrier source region 12 and a carrier drain region 14 formed in a major surface of the substrate. The source and drain are separated by a channel region 16 through which current carriers flow. Control of the conduction of the carriers through the channel 16 is achieved by voltage biasing a gate electrode 18 spaced above the channel region in alignment with edges of the source and drain and separated from the substrate by a dielectric 20. In an enhancement mode transistor, the channel 16 is nonconducting until a voltage bias is applied to induce a conductive channel under the dielectric.

In ultra large scale integrated (ULSI) microelectric circuits the transistor of FIG. 1 is fabricated according to submicron design rules in which the channel region 16 will be less than one micron in length. Because of the small dimensions, high quality ultrathin gate oxides are required.

In accordance with the present invention, an oxynitride dielectric layer having enhanced dielectric characteristics and a simple method for forming same are provided. The oxynitride layer includes a nitrogen profile extending from the interface of the oxynitride layer and underlying silicon substrate. The oxidation rate in forming the oxynitride layer is much slower than that of a conventional silicon oxide formed in a pure oxygen ambient, thus control of the layer thickness is easier to maintain. The nitrogen concentration increases with increasing temperature. The oxynitride layer is then nitrided in an atmosphere of $NH_3$ and annealed in an atmosphere of $N_2$.

Figure 2:
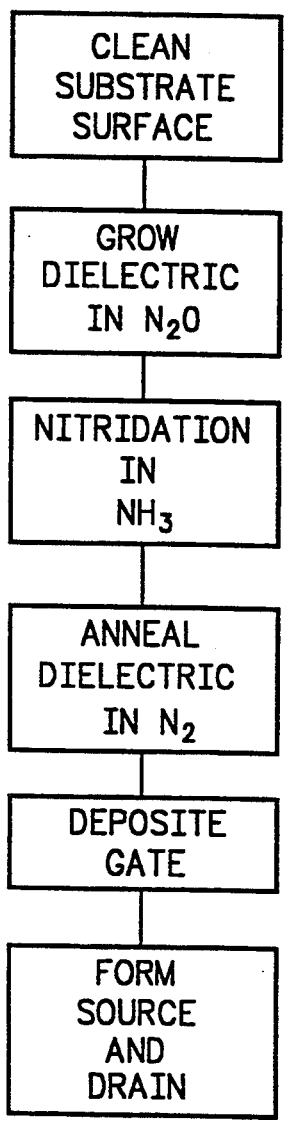
FIG. 2 is a flow diagram of a process of forming a dielectric in the device of FIG. 1 in accordance with the invention.

FIG. 2 illustrates a flow diagram in the process for forming the oxynitride dielectric. As is described in Kwong et al., "Electrical Characteristics of Ultrathin Oxynitride Gate Dielectric Prepared by Rapid Thermal Oxidation of Si in $N_2O$," Applied Physics Letters 57(10), 3 Sep. 1990, the surface of the silicon substrate on which the oxynitride is to be grown is initially cleaned using a conventional RCA wet chemical process. Thereafter, the substrate is placed in an atmosphere of essentially pure nitrous oxide. With the temperature raised to 900°-1100° C. oxidation of the silicon substrate occurs with a nitrogen gradient extending upwardly in the dielectric layer from the silicon/silicon oxide interface. Thickness of the dielectric layer is readily controlled since the oxidation of the silicon surface is at a much lower rate than oxidation in a pure oxygen ambient.

In accordance with the invention, the oxide dielectric layer is then heated in an atmosphere of anhydrous ammonia ($NH_3$) to increase the nitrogen atom content of the dielectric to prevent boron penetration and with reduced charge trapping and suppressed interface generation. The ammonia is introduced at atmospheric pressure and then heated to a temperature in the range of 800° C.–1100° C. preferably between 850° C.–950° C. for a time period between 30 seconds and 30 minutes.

After nitriding of the dielectric layer, thermal annealing is performed in a nitrogen ($N_2$) ambient for a short period of time (e.g., 60 seconds) at the oxidation temperature to reduce fixed charge density. The above steps can be carried out in-situ in a rapid thermal system without removing the wafer from the chamber. Thereafter the gate electrode is formed by depositing polysilicon which is then doped. Finally, the source and drain regions are formed by implant followed by annealing in dry oxygen. Aluminum contacts can then be deposited by sputtering and patterned to complete the interconnection in the integrated circuit.

The invention has been verified using MOS capacitors fabricated on 3–5 Ω-cm (100) Si substrates. Control and $N_2O$-oxides (~80 Å, measured by ellipsometry and C-V) were grown at 950° C. in a resistance heated furnace in $O_2$ and $N_2O$ ambients, respectively. Some samples with control and $N_2O$-oxides were nitrided in $NH_3$ for different durations at 900° C., followed by $N_2$ annealing at 950° C. for 20 min. SIMS measurements indicated a significant increase in interfacial [N] by $NH_3$-nitridation (e.g., [N] ~ 10% after 5 min. $NH_3$-nitridation. Electrical and reliability properties were studied on $POCl_3$-doped $n^+$-polysilicon gated MOS capacitors (gate areas: $5 \times 10^{-4}$, $5 \times 10^{-5}$ cm$^2$) fabricated on p-type substrate. $P^+$-polysilicon gates for capacitors on n-type substrate were prepared by $BF_2$-implant ($5.5 \times 10^{15}$ cm$^{-2}$, 50 KeV) followed by drive-in anneal in $N_2$ at 900° C. for 30 min. These capacitors (areas: $5 \times 10^{-4}$ cm$^2$) wee used to study boron penetration.

Fixed charge ($N_f$) and midgap interface state density ($D_{it-m}$) were extracted from C-V data on capacitors with various gate dielectrics. Unlike the large increase ($\sim 2 \times 10^{11}$ cm$^{-2}$) in $N_f$ by 5 min $NH_3$-nitridation of pure oxides, the increase in $N_f$ by $NH_3$-nitridation of $N_2O$-oxides is significantly smaller ($\sim 7 \times 10^{10}$ cm$^{-2}$).

$D_{it-m}$) values in the range of $4-7 \times 10^{10}$ eV$^{-1}$ cm$^{-2}$ were observed for $NH_3$-nitrided $N_2O$-oxides.

Figure 3:
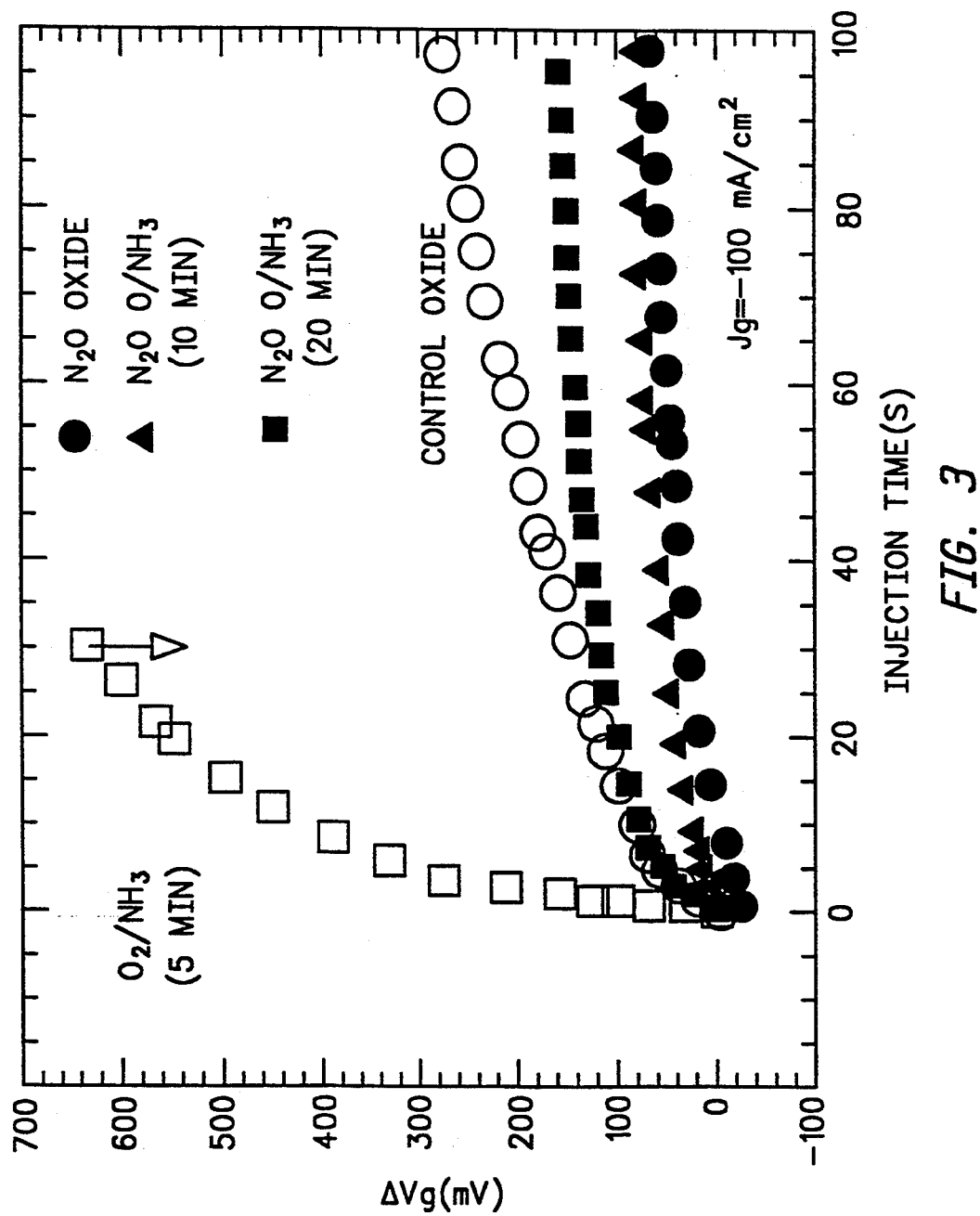
FIG. 3 illustrates changes in gate voltage required to maintain a constant current density of Å100 $mA/cm^2$ in MOS capacitors (area: $5\times10^4$ $cm^2$) with different gate dielectrics.

Charge trapping properties of $NH_3$-nitrided $N_2O$ oxides were studied by monitoring the changes in gate voltage ($\Delta V_g$) to maintain a constant current density ($-100$ mA/cm$^2$) in MOS capacitors. As shown in FIG. 3, $NH_3$-nitrided pure oxides show a positive $\Delta V_g$, indicating significant electron trapping by nitridation induced traps. Nevertheless, even after 20 min $NH_3$-nitridation, $N_2O$-oxides show only a small increase in electron trapping. $\Delta V_g$ in $NH_3$-nitrided pure oxides does not show a saturating trend, indicating a significant amount of high-field induced trap generation. On the contrary, despite a severe $NH_3$-nitridation, the trap generation rate in $N_2O$-oxides is negligible. Consequently, even after a severe $NH_3$-nitridation, $N_2O$-oxides still show superior charge trapping properties compared to conventional oxides. Thus, it is possible to fabricate p-MOSFETs using these gate dielectrics, which show superior hot-carrier reliability, unlike p-MOSFETs with reoxidized $NH_3$-nitrided oxides which show worse reliability than those with conventional gate oxides. These observations are quite significant, because they imply that the trade-off between sufficient [N] for better barrier properties vs. worse electron trapping can be greatly alleviated by using $NH_3$-nitridation of $N_2O$-oxides.

Figure 4:
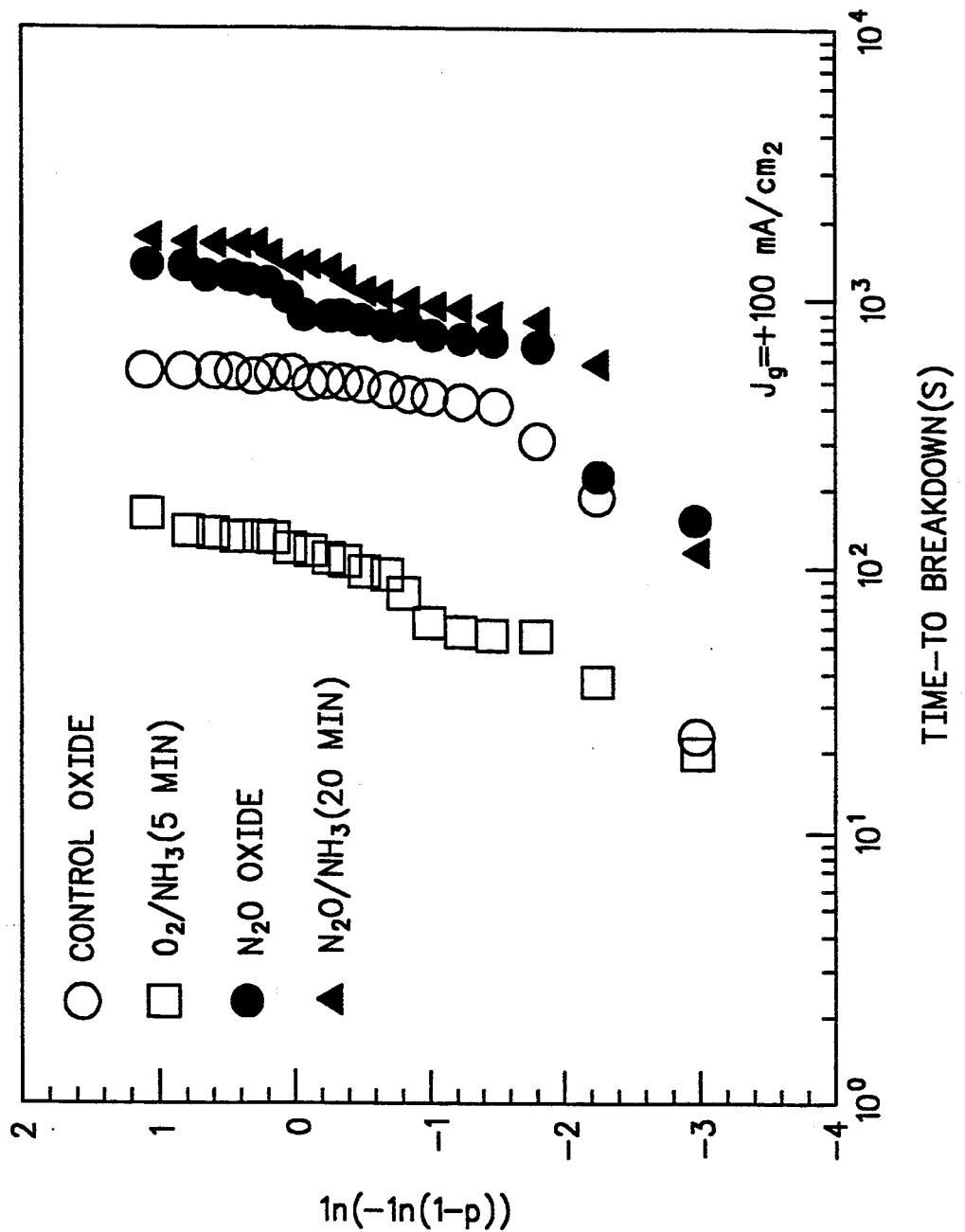
FIG. 4 illustrates Weibull plots of time-to-breakdown in MOS capacitors (area: $5\times10^{-5}$ $cm^2$) with different gate dielectrics, measured at a current density of 100 $mA/cm^2$ under positive gate bias.

FIG. 4 shows Weibull plots for time-to-breakdown ($t_{bd}$) in $n^+$-polysilicon gated capacitors with different gate dielectrics. A large degradation in $t_{bd}$ is observed in $NH_3$-nitrided $SiO_2$ due to 5 min $NH_3$-nitridation. The degradation in $t_{bd}$ is usually attributed to large electron trapping in these oxides, which is apparent from FIG. 3. Contrary to such significant degradation in $t_{bd}$ by $NH_3$-nitrided of pure oxides, 20 min $NH_3$-nitridation actually increased $t_{bd}$ in $N_2O$-oxides to some extent. $NH_3$-nitridation for 5 min degraded charge-to-breakdown $Q_{bd}$ (50% failure @ 100 mA/cm$^2$) in pure oxides from 50 C/cm$^2$ to 10.4 C/cm$^2$, while 20 min $NH_3$-nitridation improved $Q_{bd}$ from 90 C/cm$^2$ to 118 C/cm$^2$ in $N_2O$-oxides.

Figure 5:
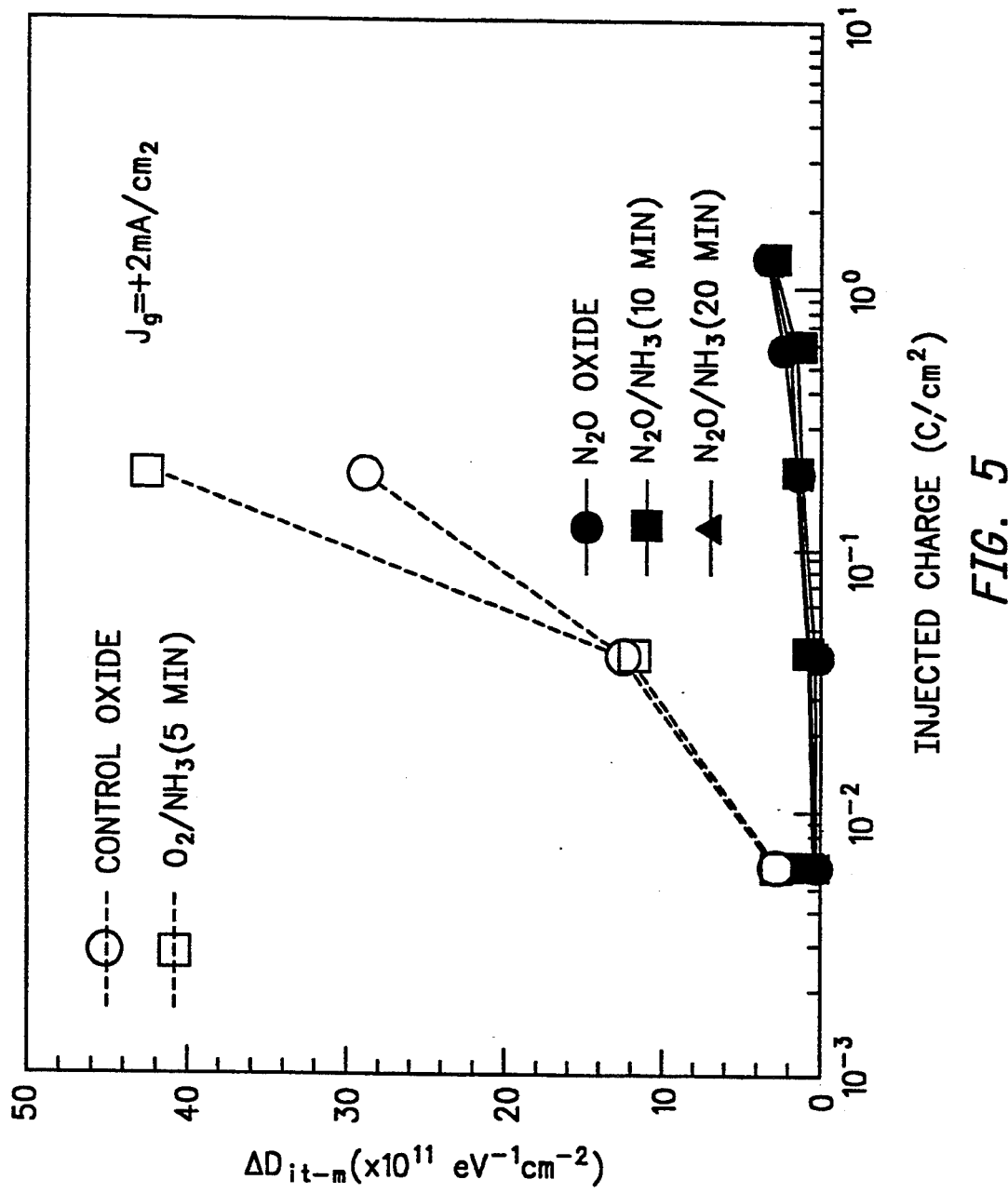
FIG. 5 illustrates increase in midgap interface state density ($\Delta D_{it-m}$) in MOS capacitors (area: $5\times10^{-4}$ $cm^2$) with different gate dielectrics, caused by F-N injection at a current density of 2 $mA/cm^2$ with positive gate bias.

Interface state generation ($\Delta D_{it}$) in these devices due to constant current stress if plotted in FIG. 5. $NH_3$-nitridation increases $\Delta D_{it}$ in pure oxides. However, $\Delta D_{it}$ in $NH_3$-nitrided $N_2O$-oxides is comparable to the $N_2O$-oxides. The large $\Delta d_{it}$ in $NH_3$-nitrided pure oxides is attributed to a distorted interfacial region due to the formation of mismatched Si-N bonds in the Si-O network. However, as seen from FIG. 5, nitrogen incorporation in $N_2O$-oxides by $NH_3$-nitridation does not lead to such undesirable effect. This observation suggests nitrogen incorporation at the interface by $NH_3$-nitridation of $N_2O$-oxides is somewhat different from that in pure oxides.

Figure 6:
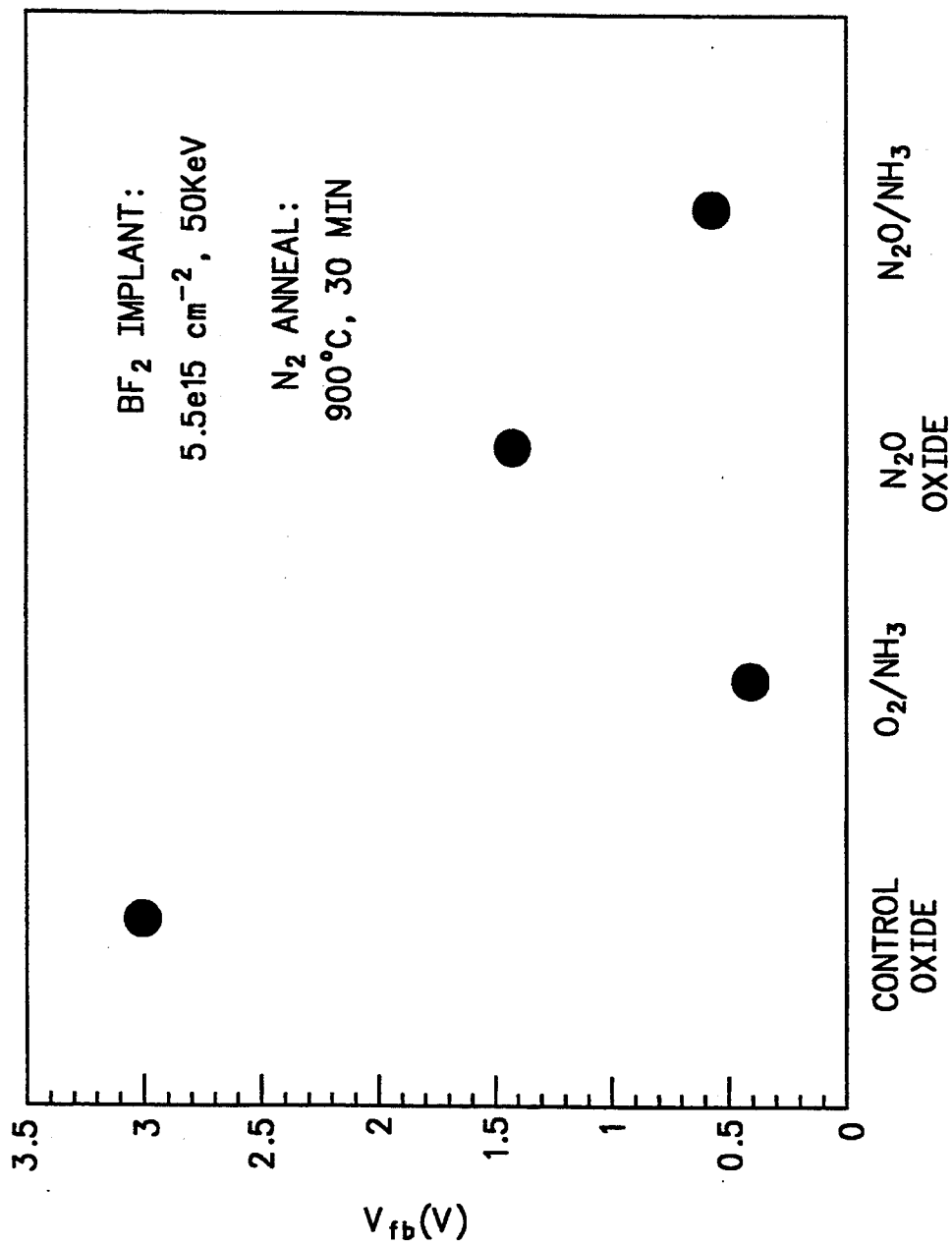
FIG. 6 illustrates flatband voltage in $BF_2$-implanted $p^+$-polysilicon gate MOS capacitors with different gate dielectrics after $N_2$ anneal at 900° C. for 30 min.

To study the barrier properties against boron penetration, flatband voltages ($V_{fb}$) were monitored for $p^+$-polysilicon gate capacitors with various dielectrics. Since the penetrated active boron acts as a thin sheet of negative oxide charge at the Si/SiO$_2$ interface, the extent of penetration can be estimated from $V_{fb}$ measurements. As shown in FIG. 6, after a 30 min drive-in anneal in $N_2$ at 900° C. positive $V_{fb}$ values are observed for all capacitors, indicating boron penetration in all these devices. The oxide negative charge due to boron penetration, estimated from the $V_{fb}$ values and corrected for $N_f$, was $9.8 \times 10^{12}$, $2.3 \times 10^{12}$, $5.6 \times 10^{12}$ and $3.0 \times 10^{12}$ cm$^{-2}$ for pure oxide, $NH_3$-nitrided pure oxide, $N_2O$-oxide and $NH_3$-nitrided $N_2O$-oxide, respectively. As can he seen, boron penetration in $NH_3$-nitrided $N_2O$-oxides is comparable to $NH_3$-nitrided pure oxides, hut is less than that in $N_2O$-oxides, which, by itself, shows better resistance to boron penetration than pure oxides.

There has been described a new process of $NH_3$-nitridation of $N_2O$-oxides to introduce sufficient amount of nitrogen at the $Si/SiO_2$ interface. This resulting dielectric has excellent electrical and reliability characteristics, without exhibiting the undesirable side-effects as in the case of $NH_3$-nitridation of pure oxides. Moreover, an improved resistance to boron penetration is achieved due to sufficient nitrogen at the interface, which is desirable for the fabrication of $p^+$-polysilicon gated surface channel p-MOSFETs.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating an MIS transistor comprising the steps of
   a) providing a monocrystalline silicon substrate having a major surface,
   b) cleaning said major surface,
   c) placing said body in an atmosphere of nitrous oxide,
   d) heating said body and atmosphere at a temperature for the oxidation of said major surface thereby forming a oxynitride layer with nitrogen atoms therein,
   e) heating said silicon substrate and oxynitride layer in an atmosphere of anhydrous ammonia to introduce additional nitrogen atoms in said oxynitride layer,
   f) annealing said silicon substrate and oxynitride layer in an atmosphere of nitrogen,
   g) forming a gate electrode on said oxynitride layer, and
   h) forming a source region and a drain region in said silicon body abutting said major surface and aligned with said gate electrode.

2. The method as defined by claim 1 wherein step g) includes forming a layer of material on said oxynitride layer and etching said layer of material and said oxynitride layer to form said gate electrode with said oxynitride layer between said gate electrode and said major surface.

3. The method as defined by claim 2 wherein said layer of material comprises polycrystalline silicon.

4. The method as defined by claim 2 wherein said material comprises a metal.

5. The method as defined by claim 1 wherein step c) includes placing said substrate in an atmosphere of essentially pure nitrous oxide.

6. The method as defined by claim 5 wherein said nitrous oxide is approximately 99.998% pure.

7. The method as defined by claim 5 wherein step d) includes heating said substrate and atmosphere to a temperature above 900° C.

8. The method as defined by claim 7 wherein step d) includes heating said substrate and atmosphere to a temperature in the range of 900°–1100° C.

9. The method as defined by claim 1 wherein step e) includes heating said substrate and atmosphere to a temperature in the range of 800° C.–1100° C.

10. The method as defined by claim 1 wherein step e) includes heating said substrate and atmosphere to a temperature in the range of 850° C.–950° C.

11. A method of fabricating a oxynitride layer on a surface of a silicon body with nitrogen atoms dispersed i said oxynitride layer and having a profile having a peak at the oxynitride-silicon interface comprising the steps of
    a) cleaning said surface,
    b) placing said body in an atmosphere of nitrous oxide,
    c) heating said body and said atmosphere at a temperature for the oxidation of said surface thereby forming a oxynitride layer on said major surface with nitrogen atoms therein, and
    d) heating said body and oxynitride layer in an atmosphere of anhydrous ammonia to introduce additional nitrogen atoms in said oxynitride layer.

12. The method as defined by claim 11 wherein step b) includes placing said substrate in an atmosphere of essentially pure nitrous oxide.

13. The method as defined by claim 12 wherein said nitrous oxide is approximately 99.998% pure.

14. The method as defined by claim 12 wherein step c) includes heating said body and atmosphere to a temperature above 900° C.

15. The method as defined by claim 11 and further including the step of
    a) annealing said oxynitride layer in an atmosphere of nitrogen.

16. The method as defined by claim 11 wherein step c) includes heating said body and atmosphere to a temperature in the range of 900°–1100° C.

17. The method as defined by claim 11 wherein step d) includes heating said body and atmosphere to a temperature in the range of 800° C.–1100° C.

18. The method as defined by claim 11 wherein step d) includes heating said body and atmosphere to a temperature in the range of 850° C.–950° C.

* * * * *